(12) United States Patent
Hong

(10) Patent No.: US 7,105,885 B2
(45) Date of Patent: Sep. 12, 2006

(54) SEMICONDUCTOR DEVICE HAVING DIFFUSION BARRIER LAYER CONTAINING CHROME AND METHOD FOR FABRICATING THE SAME

(75) Inventor: Suk-Kyoung Hong, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/334,072

(22) Filed: Dec. 31, 2002

(65) Prior Publication Data

US 2004/0053465 A1 Mar. 18, 2004

(30) Foreign Application Priority Data

Sep. 17, 2002 (KR) .................. 10-2002-0056461

(51) Int. Cl.
*H01L 27/108* (2006.01)

(52) U.S. Cl. .............................. 257/306; 257/E27.048

(58) Field of Classification Search ............... 257/295, 257/303–311
See application file for complete search history.

(56) References Cited

U.S. PATENT DOCUMENTS

| 6,090,697 | A | * | 7/2000 | Xing et al. ............... 438/618 |
| 6,117,725 | A | * | 9/2000 | Huang ...................... 438/241 |
| 6,180,974 | B1 | | 1/2001 | Okutoh et al. |
| 6,190,963 | B1 | | 2/2001 | Zhang et al. |
| 6,288,420 | B1 | | 9/2001 | Zhang et al. |
| 6,320,213 | B1 | | 11/2001 | Kirlin et al. |
| 6,399,521 | B1 | | 6/2002 | Zhang et al. |
| 2002/0096734 | A1 | * | 7/2002 | Natsume ................... 257/508 |
| 2003/0077874 | A1 | * | 4/2003 | Hsu et al. ................. 438/396 |

FOREIGN PATENT DOCUMENTS

| JP | 12-307071 A | 11/2000 |
| KR | 2000-15240 A | 3/2000 |
| KR | 2000-42447 A | 7/2000 |

* cited by examiner

*Primary Examiner*—Scott B. Geyer
(74) *Attorney, Agent, or Firm*—Birch, Stewart, Kolasch & Birch, LLP

(57) ABSTRACT

A semiconductor device is provided which is capable of preventing a constitutional material of a diffusion barrier layer from diffusing into a bottom electrode during a high thermal process and of preventing an increase in contact resistance of a contact plug by suppressing mutual diffusions of the constitutional material of the diffusion barrier layer and the contact plug and a method for fabricating the same. The semiconductor device includes a bottom electrode of a capacitor connecting to a substrate through a contact plug; a first diffusion barrier layer disposed on the contact plug, wherein the first diffusion barrier contains Cr therein for preventing mutual diffusions between the bottom electrode and the contact plug; and a second diffusion barrier on the first diffusion barrier for preventing the Cr in the first diffusion layer from diffusing into the bottom electrode; a dielectric layer disposed on the bottom electrode and a top electrode disposed on the dielectric layer.

4 Claims, 11 Drawing Sheets

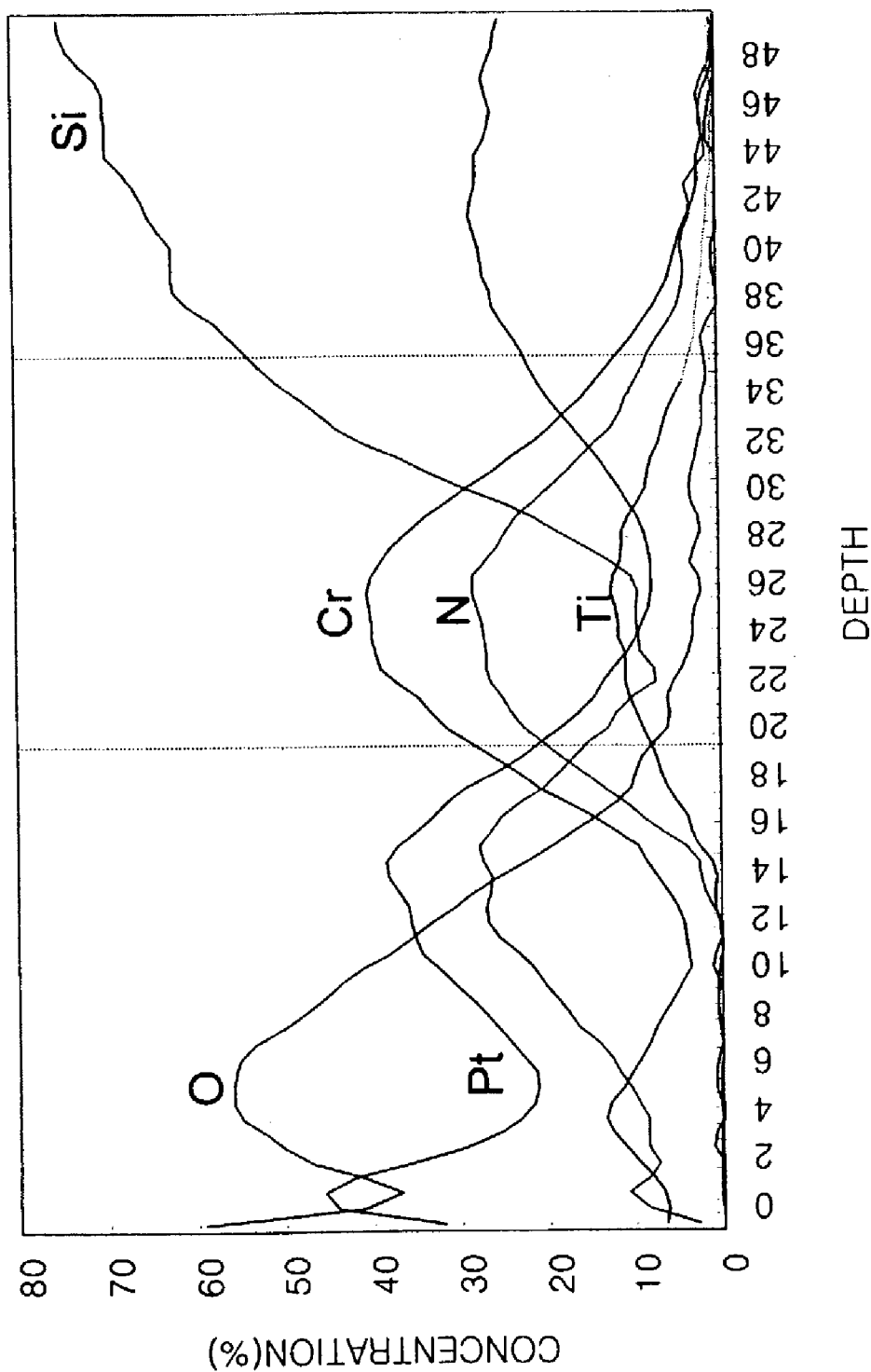

SEMICONDUCTOR DEVICE HAVING DIFFUSION BARRIER LAYER CONTAINING CHROME AND METHOD FOR FABRICATING THE SAME

FIELD OF THE INVENTION

The present invention relates to a method for fabricating a semiconductor device; and, more particularly, to a semiconductor device having a diffusion barrier layer containing chrome and a method for fabricating the same.

DESCRIPTION OF RELATED ARTS

In a semiconductor memory device such as a ferroelectric random access memory (FeRAM) device and a dynamic random access memory (DRAM) device, a capacitor has a structure stacked of a top electrode, a dielectric layer for storing charges and a bottom electrode. The capacitor is electrically connected to one side of an active area of a transistor through a doped polysilicon plug or a tungsten plug. The charges stored into the capacitor move into a bit line by passing through a channel of the transistor and then the other side of the active area of the transistor.

A process for forming a thin film using a high dielectric material such as $(Ba,Sr)TiO_3$ (BST) and $SrTiO_3$ (ST) or a ferroelectric material such as $Pb(Zr,Ti)O_3$ (PZT), $(SrBi_2Ta_2O_9)$ (SBT) and $(Bi,La)_4Ti_3O_{12}$ (BLT) is proceeded at a high temperature ranging from about 650° C. to about 800° C., and a deposition and a subsequent thermal processes are generally carried out in an atmosphere of oxygen.

FIG. 1A is a cross-sectional view showing a capacitor having a plug structure in accordance with a prior art.

Referring to FIG. 1A, a field oxide layer 11, which is a device isolation layer, and a conductive area 12A such as a source/drain of a transistor are formed. A gate oxide layer 12B and a gate electrode 12C are formed on top of a substrate 10. Then, an inter-layer insulating layer (hereinafter referred as to ILD) 13 is formed on top of the substrate 10 including the field oxide layer 11 and the conductive area 12A. A polysilicon plug 14 is filled into a contact hole contacting to the substrate 10 by passing through the ILD 13. Afterwards, a capacitor is formed on the polysilicon plug 14 and the ILD 13 by stacking sequentially a diffusion barrier layer 15, a bottom electrode 16, a dielectric layer 17 and a top electrode 18. Herein, the capacitor is electrically connected to the transistor through the polysilicon plug 14, which is generally called a storage node contact plug.

In case of adopting the dielectric layer 17 that uses a high dielectric material or a ferroelectric material in accordance with the above prior art, it is required to perform a deposition process and a subsequent thermal process at a high temperature in a range from about 650° C. to about 800° C. in an atmosphere of oxygen to secure a predetermined dielectric coefficient and leakage current characteristics. Therefore, a stacked-type capacitor employing a high dielectric material or a ferroelectric material uses such metal as Pt, Ru and Ir or conductive oxides such like $IrO_2$ and $RuO_2$. Herein, the metal used in the stacked-type capacitor have excellent heat resisting and oxide resisting characteristics and electric conductivity.

However, since the dielectric layer 17 employing the high dielectric material or the ferroelectric material is deposited at a high temperature in an atmosphere of oxygen, oxygen is easily diffused into the dielectric layer 17. As a result of this diffusion, the diffusion barrier layer 15 allocated on between the bottom electrode 16 and the polysilicon plug 14 is oxidized, or a surface of the polysilicon plug 14 is oxidized as the oxygen diffuses through the diffusion barrier layer 15.

If the diffusion barrier layer 15 or the surface of the polysilicon plug is oxidized, there is a problem of increasing electric resistance between conductive areas of the capacitor and the transistor. In a severe case, there is a further problem of disconnecting the electric connection.

Conversely, since the conductive area 12 or silicon existing inside of the polysilicon plug 14 diffuses towards the bottom electrode 16, properties of a material used in the dielectric layer 17 are degraded. Furthermore, in case of using Pt, the bottom electrode 16 of the capacitor and the polysilicon plug 14 are directly contacted, these two materials react with each other at a temperature greater than about 200° C., resulting in a formation of PtSi having the Shottky barrier characteristic. As a result, degradation of contact resistance characteristic occurs.

Hence, the diffusion barrier layer 15 is typically formed on between the bottom electrode of the capacitor and the polysilicon plug or between the bottom electrode and the conductive area in order to suppress mutual diffusions of oxygen and silicon and prevent a direct contact of the bottom electrode and the polysilicon plug.

A TiN layer having low resistivity and excellent diffusion barrier characteristics at a temperature below about 500° C. is commonly used for the diffusion barrier layer 15. However, the TiN layer loses its function as the diffusion barrier layer against the oxygen and silicon at a temperature above about 500° C. in an atmosphere of oxygen. Thus, there are many limitations in process recipes including temperatures for a dielectric layer deposition and a subsequent thermal process. Meanwhile, it is suggested to use a nitride-based diffusion barrier layer such as TiSiN and TiAlN in addition to the TiN layer. However, these nitride-based diffusion barrier layers have an oxide resisting temperature ranging merely from about 500° C. to about 550° C. This narrow range of the oxide resisting temperature limits the process recipes including a temperature for a deposition process with respect to a dielectric or ferroelectric thin film and a temperature for a subsequent thermal process. Accordingly, it is very difficult to secure good capacitor characteristics.

To solve the above problems, instead of using the nitride-based diffusion barrier layer including the TiN layer, it is proposed to use $Cr_xTi_{1-x}N$ having excellent oxide resisting characteristic as the diffusion barrier layer. Herein, X ranges $0<X<1$.

However, problems of using the $Cr_xTi_{1-x}N$ as the diffusion barrier layer will be explained in the following by referring to FIG. 1B.

FIG. 1B is a diagram illustrating problems of the capacitor adopting the $Cr_xTi_{1-x}N$ as the diffusion barrier layer.

As shown in FIG. 1B, although the $Cr_xTi_{1-x}N$ has a high oxide resisting temperature greater than approximately 700° C., Cr is still diffused into the bottom electrode during a subsequent thermal process proceeded at a temperature above approximately 700° C. This diffusion of the Cr results in damages of the bottom electrode structure and degradations of bottom electrode characteristics. This result further degrades characteristics of the dielectric layer deposited on the bottom electrode.

Accordingly, the diffusion barrier layer allocated on between the contact plug and the bottom electrode requires excellent oxide resisting characteristics. It is also required to develop a new method for preventing a constitutional material of the diffusion barrier layer from diffusing into the bottom electrode during the thermal process subsequent to the deposition process.

SUMMARY OF THE INVENTION

It is, therefore, an object of the present invention to provide a semiconductor device capable of preventing a constitutional material of a diffusion barrier layer from diffusing into a bottom electrode of a capacitor during a thermal process and a method for fabricating the same.

It is another object of the present invention to provide a semiconductor device capable of preventing an increase in contact resistance of a storage node contact plug by suppressing mutual diffusions of the storage node contact plug and the constitutional material of the diffusion barrier layer and a method for fabricating the same.

In accordance with an aspect of the present invention, there is provided a semiconductor device, including: a bottom electrode of a capacitor connecting to a substrate through a contact plug; a first diffusion barrier layer on the contact plug, wherein the first diffusion barrier layer contains Cr therein for preventing mutual diffusions between the bottom electrode and the contact plug; and a second diffusion barrier on the first diffusion barrier for preventing the Cr in the first diffusion layer from diffusing into the bottom electrode; a dielectric layer on the bottom electrode; and a top electrode on the dielectric layer.

Preferably, the first diffusion barrier layer is $Cr_xMe_{1-x}N$ containing Cr, metal (Me) and $N_2$, while the second diffusion barrier layer is any one material selected from a group consisting of $IrO_2$, $RuO_2$ and $SrRuO_3$. Particularly, the metal (Me) is any one substance selected among Ti, Ta and Al, and a compositional ratio (X) of Cr contained within the $Cr_xMe_{1-x}N$ ranges from about 0.2 mol to about 0.8 mol.

In accordance with another aspect of the present invention, there is also provided a method for fabricating a semiconductor device, comprising the steps of: forming an inter-layer insulating layer on a substrate; forming a contact hole in the inter-layer insulating layer; forming a contact plug connecting to the substrate through the contact hole; forming a first diffusion barrier layer containing Cr on the contact plug and the inter-layer insulating layer; forming a second diffusion barrier layer on the first diffusion barrier layer for preventing diffusions of the Cr in the first diffusion barrier layer; and forming a capacitor including a bottom electrode, a dielectric layer and a top electrode on the second diffusion barrier layer.

Preferably, the first diffusion barrier layer is any one material selected from a group consisting of Ti/TiN, TiN, TaN, TiAlN and TiSiN. Also, the second diffusion barrier layer is $Cr_xMe_{1-x}N$ containing Cr, metal (Me) and $N_2$, while the third diffusion barrier layer is any one material selected from a group consisting of $IrO_2$, $RuO_2$ and $SrRuO_3$. Especially, the metal (Me) is any one substance selected among Ti, Ta and Al, and a compositional ratio (X) of Cr contained within the $Cr_xMe_{1-x}N$ ranges from about 0.2 mol to about 0.8 mol.

BRIEF DESCRIPTION OF THE DRAWING(S)

The above and other objects and features of the present invention will become apparent from the following description of the preferred embodiments given in conjunction with the accompanying drawings, in which:

FIGS. 8A and 8B are graphs showing a result after analyzing a degree of mutual diffusions in a stacked structure of Pt/CrTiN/Si;

DETAILED DESCRIPTION OF THE INVENTION

In the following preferred embodiments, a diffusion barrier layer between a contact plug and a bottom electrode uses a double layer of conductive oxide layers selected from a group consisting of a $Cr_xMe_{1-x}N$ thin film, where X ranges from about 0.2 mol to about 0.8 mol and M is Ti, Ta or Al, $IrO_2$, $RuO_2$ and $SrRuO_3$.

Herein, the $Cr_xMe_{1-x}N$ thin film is a tertiary diffusion barrier layer having excellent oxide resisting characteristics compared to a TiN layer. Also, the conductive oxide layer disposed between the $Cr_xMe_{1-x}N$ thin film and the bottom electrode acts as a diffusion barrier layer for preventing Cr contained within the $Cr_xMe_{1-x}N$ thin film from diffusing into the bottom electrode.

Figure 1A:
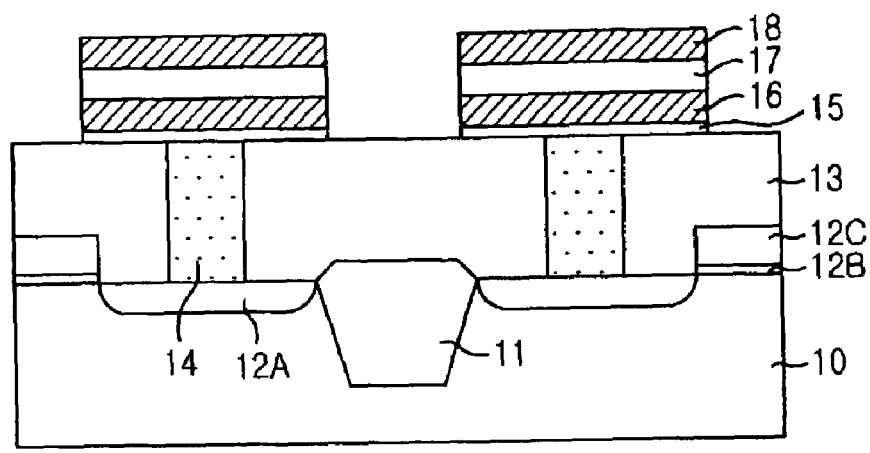
FIG. 1A is a cross-sectional view showing a semiconductor device in accordance with a prior art.
Figure 1B:
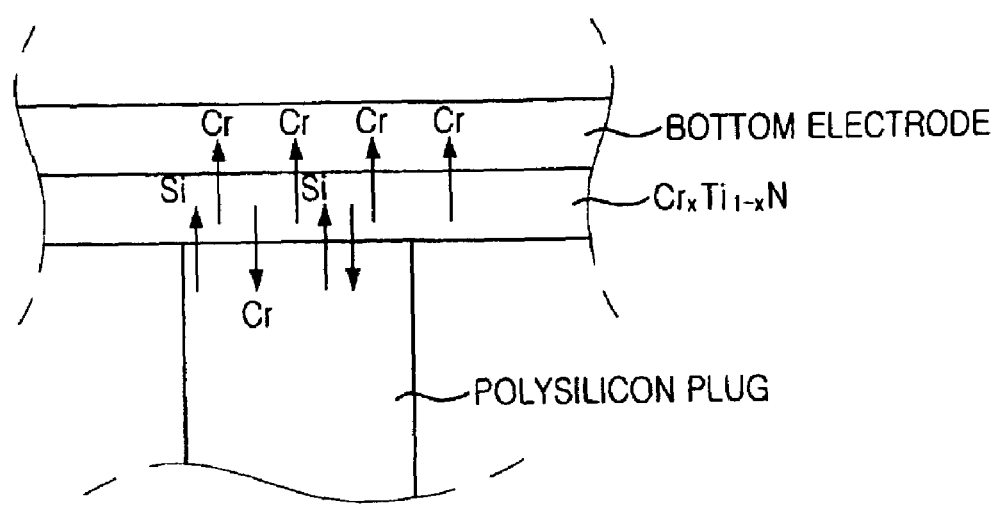
FIG. 1B is a diagram illustrating problems of a capacitor adopting $Cr_xTi_{1-x}N$, where 0<X<1, as a diffusion barrier layer.
Figure 2:
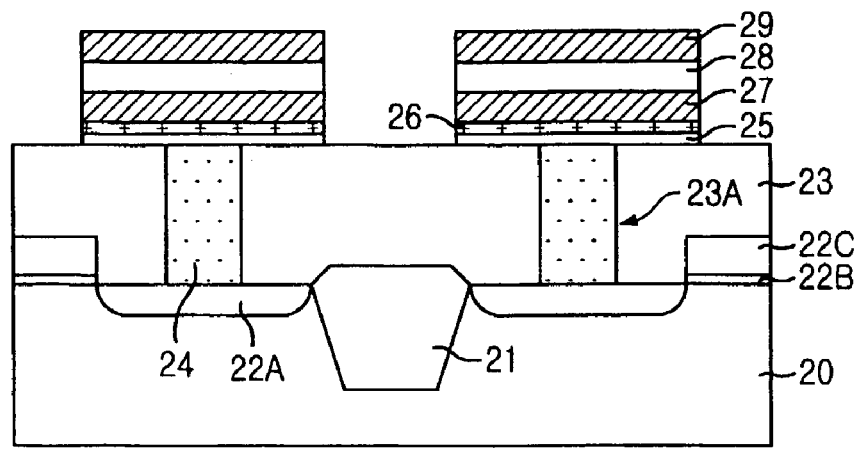
FIG. 2 is a cross-sectional view showing a semiconductor device in accordance with a first preferred embodiment of the present invention.

FIG. 2 is a cross-sectional view showing a semiconductor device in accordance with a first preferred embodiment of the present invention.

Referring to FIG. 2, a field oxide layer 21, which is a layer for isolating devices, and a conductive area 22A such like a source/drain of a transistor are formed. An interlayer insulating layer 23 is formed on top of a substrate 20 on which a gate oxide layer 22B and a gate electrode 22C are formed and the field oxide layer 21 and the conductive area 22A. A polysilicon plug 24 being buried within a contact hole 23A that passes through the inter-layer insulating layer 23 is connected to the conductive area 22A. A first diffusion barrier layer 25 for preventing mutual diffusions between the polysilicon plug 24 and a bottom electrode 27 is formed on top of the polysilicon plug 24 and the inter-layer insulating layer 23. Then, a second diffusion barrier layer 26 for preventing a constitutional material of the first diffusion barrier layer 25 from diffusing into the bottom electrode 27 is formed on the first diffusion barrier layer 25. On top of the second diffusion barrier layer 26, the bottom electrode 27, a dielectric layer 28 and a top electrode 29 are stacked.

As illustrated in FIG. 2, in the semiconductor device in accordance with the first preferred embodiment of the present invention, a connecting element for connecting the conductive area 22A such as the source/drain to the bottom electrode 27 of a capacitor is the polysilicon plug 24, and the first diffusion barrier layer 25 disposed between the polysilicon plug 24 and the bottom electrode 27 has an exposed barrier structure that is not buried within the contact hole 23A. Additionally, the second diffusion barrier layer 26 also has the exposed barrier structure.

Figure 3:
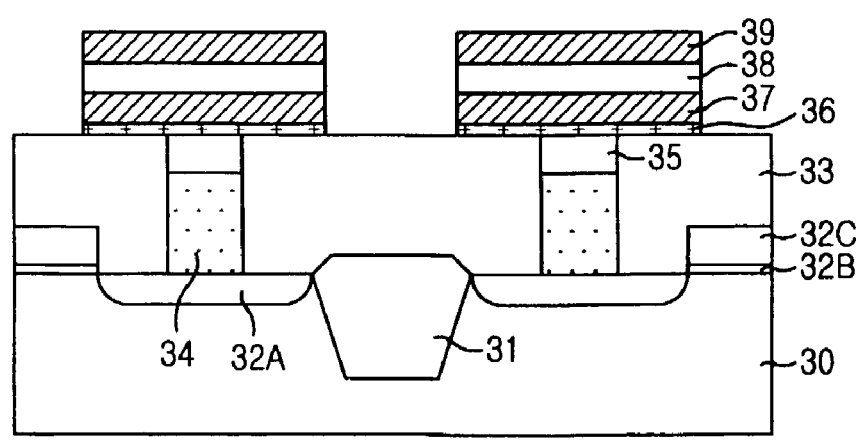
FIG. 3 is a cross-sectional view showing a semiconductor device in accordance with a second preferred embodiment of the present invention.

FIG. 3 is a cross-sectional view showing a semiconductor device in accordance with a second preferred embodiment of the present invention.

Referring to FIG. 3, a field oxide layer 31, which is a layer for isolating devices, and a conductive area 32A such like a source/drain of a transistor are formed. An interlayer insulating layer 33 is formed on top of a substrate 30 on which a gate oxide layer 32B and a gate electrode 33C are formed and surfaces of the field oxide layer 31 and the conductive area 32A. A polysilicon plug 34 being partially buried within a contact hole that passes through the inter-layer insulating layer 33 is connected to the conductive area 32A. A first diffusion barrier layer 35 for preventing mutual diffusions between the polysilicon plug 34 and a bottom electrode 37 is formed on top of the polysilicon plug 34 so to completely fill the contact hole. Then, a second diffusion barrier layer 36 for preventing a constitutional material of the first diffusion barrier layer 35 from diffusing into the bottom electrode 37 is formed on the first diffusion barrier layer 35. On top of the second diffusion barrier layer 36, the bottom electrode 37, a dielectric layer 38 and a top electrode 39 are stacked.

As shown in FIG. 3, in the semiconductor device based on the second preferred embodiment, the polysilicon plug 34 acts as a connecting element for connecting the conductive area 32A such as a source/drain to the bottom electrode 37. The first diffusion barrier layer 35 allocated on between the polysilicon plug 34 and the bottom electrode 37 has a buried barrier structure, meaning that the first diffusion barrier layer 35 is buried within the contact hole. In contrary, the second diffusion barrier layer 36 has an exposed barrier structure, meaning that the second diffusion barrier layer 36 is not buried within the contact hole.

In FIGS. 2 and 3, both of the first diffusion barriers 25 and 35 are nitride-based thin films, whereas the second diffusion barrier layer 26 and 36 are conductive oxide layers such as a metal oxide layer.

For instance, the first diffusion barrier layers 25 and 35 are thin films of $Cr_xMe_{1-x}N$ containing metal mixed of Cr, N and metal (hereinafter referred as to Me), and selected among $Cr_xTi_{1-x}N$, $Cr_xTa_{1-x}N$ and $Cr_xAl_{1-x}N$. Herein, X ranges from about 0.2 mol to about 0.8 mol. The second diffusion barrier layers 26 and 36 are selected among $IrO_2$, $RuO_2$ and $SrRuO_3$.

Also, the bottom electrodes 27 and 37 and the top electrodes 29 and 39 are selected from a group consisting of Pt, Ir, $IrO_2$, Ru, $RuO_2$, Re, Rh and a mixture of the above listed materials. The dielectric layers 28 and 38 are selected from a high dielectric material such as $(Ba,Sr)TiO_3$ (BST) and $SrTiO_3$ (ST) or a ferroelectric material such as $Pb(Zr,Ti)O_3$ (PZT), $SrBi_2Ta_2O_9$ (SBT) and $(Bi,La)_4Ti_3O_{12}$ (BLT).

In addition, the inter-layer insulating layers 23 and 33 are selected from an oxide, a nitride or a mixture of these two. For instance, the inter-layer insulating layers 23 and 33 are selected from a group consisting of silicon oxide-based oxides such as undoped silicate glass (USG), phosphorous-doped silicate glass (PSG), boron and phosphorous-doped silicate glass (BPSG), silicon nitride-based nitrides such as silicon oxynitride (SiON) and $Si_3N_4$ and a mixture of the above two silicon oxide-based oxides and the silicon nitride-based nitrides.

Meanwhile, in comparison to the exposed barrier structure, the buried barrier structure wherein the first diffusion barrier layer 35 is buried within the contact hole has an advantage that lateral sides of the first diffusion barrier layer 35 is blocked and protected from being exposed during a subsequent thermal process. Also, the buried barrier structure has another advantage that patterning procedures of the capacitor can be easily carried out due to an omission of the first diffusion barrier layer 35 when patterning the capacitor.

In accordance with the first and the second preferred embodiments of the present invention, it is possible to prevent a constitutional material of the first diffusion barrier layers 25 and 35 from diffusing into the bottom electrodes 27 and 37 since the second diffusion barrier layers 26 and 36 are disposed between the first diffusion barrier layers 25 and 35 and the bottom electrodes 27 and 37, respectively. (Also, it is possible to prevent deformations of the bottom electrodes and degradations of the capacitor characteristics. It is further possible to prevent degradations of characteristics pertained to the dielectric layer 28 and 38 being formed on the bottom electrodes 27 and 37, respectively.

Figure 4A:
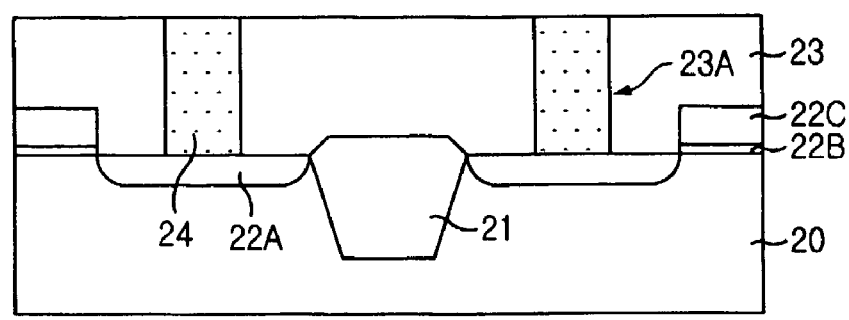
FIGS. 4A and 4B are cross-sectional views illustrating a method for fabricating the semiconductor device of FIG. 2.
Figure 4B:
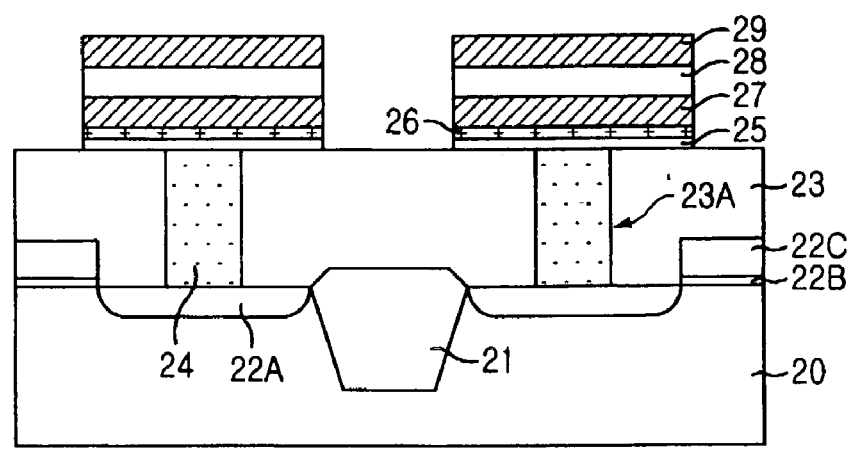

FIGS. 4A and 4B are cross-sectional views illustrating a method for fabricating the semiconductor device of FIG. 2.

Referring to FIG. 4A, a field oxide layer 21 is formed on a substrate 20 through a shallower trench isolation (STI) technique or a local oxidation of silicon (LOCOS) technique. Herein, the field oxide layer 21 acts as a device isolation layer. Subsequently, a gate oxide layer 22B and a gate electrode 22C are formed on the substrate 20. Also, a conductive area 22A acting as a source/drain of a transistor is formed by doping impurities on the substrate 20. Then, on top of the substrate 20, an inter-layer insulating layer 23 is deposited and planarized. At this time, although it is not illustrated in FIG. 4A, a bit line can be formed after forming the inter-layer insulating layer 23.

Next, a contact mask (not shown) defining a storage node contact (SNC) is formed on the inter-layer insulating layer 23. An inter-layer insulating layer 23 is etched with use of the contact mask as an etch mask so to form a contact hole 23A exposing the conductive area 22A.

Then, a polysilicon layer is deposited on the interlayer insulating layer 23 until completely filling the contact hole 23A. The polysilicon layer is proceeded with a chemical mechanical polishing (CMP) process until exposing a surface of the inter-layer insulating layer 23A so that the polysilicon layer is plugged into the contact hole 23A. Hereinafter, the polysilicon layer plugged into the contact hole 23A is referred as to a polysilicon plug 24. An upper surface of the polysilicon plug 24 has a height identical to the surface of the inter-layer insulating layer 23. As a result of the identical height, there is provided a planarized structure after filling the polysilicon plug 24 and prior to a subsequent process.

With reference to FIG. 4B, a first diffusion barrier layer 25, a second diffusion barrier layer 26, a bottom electrode 27, a dielectric layer 28 and a top electrode 29 are sequentially formed on top of the silicon plug 24 and the inter-layer insulating layer 23. Afterwards, a stacked capacitor is formed through a capacitor patterning process.

Herein, the first diffusion barrier layer 25 is selected from $Cr_xTi_{1-x}N$, $Cr_xTa_{1-x}N$ or $Cr_xAl_{1-x}N$. Herein, X ranges from about 0.2 mol to about 0.8 mol. In the meantime, the second diffusion barrier layer 26 is selected from a group consisting of $IrO_2$, $RuO_2$ and $SrRuO_3$.

Also, the bottom electrode 27 and the top electrode 29 are any one selected from a metal layer selected from a group consisting of Pt, Ir, Ru, Re and Rh, a conductive oxide layer selected from $IrO_2$ or $RuO_2$ or a mixture of the above metal layer and the conductive oxide layer.

Moreover, the dielectric layer 28 is selected from a high dielectric material such as $(Ba,SR)TiO_3$ (BST) and $SrTiO_3$ (ST) or a ferroelectric material such as $Pb(Zr,Ti)O_3$ (PZT), $SrBi_2Ta_2O_9$ (SBT) and $(Bi,La)_4Ti_3O_{12}$.

Meanwhile, since the second diffusion layer 26 is a conductive oxide layer, it can act as the bottom electrode 27. Therefore, in case of skipping the formation of the second diffusion barrier layer 26, it is possible to alternatively form the bottom electrode 27 having a stacked structure wherein the conductive oxide is deposited as the most bottom layer.

In accordance with the second preferred embodiment of the present invention as illustrated in FIG. 3, the polysilicon plug 34 is first formed by applying a recess etch-back process to the polysilicon layer so that the polysilicon plug 34 and the first diffusion barrier layer 35 are buried within the contact hole. After performing the recess etch-back process, an upper portion of the recessed polysilicon plug 34 is buried by depositing the first diffusion barrier layer 35. At this time, after depositing a layer for the first diffusion barrier layer 35, the first diffusion barrier layer 35 is formed through a CMP process until exposing a surface of the inter-layer insulating layer 33.

Figure 5:
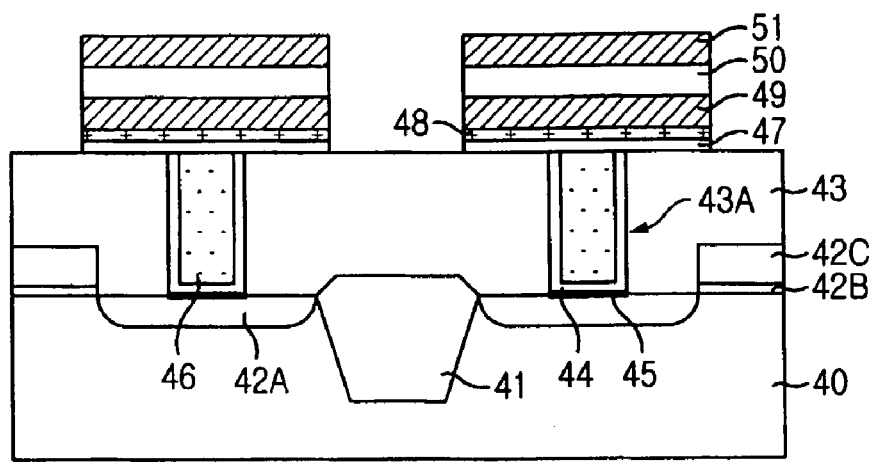
FIG. 5 is a cross-sectional view of a semiconductor device in accordance with a third preferred embodiment of the present invention.

FIG. 5 is a cross-sectional view of a semiconductor device in accordance with a third preferred embodiment of the present invention.

With reference to FIG. 5, a field oxide layer 41, which is a device isolation layer, and a conductive area 42A such like a source/drain of a transistor are formed. An interlayer insulating layer 43 is formed on top of a substrate 40 on which a gate oxide layer 42B and a gate electrode 42C are formed and surfaces of the field oxide layer 41 and the conductive area 42A. A tungsten plug 46 buried within a contact hole 43A that passes through the inter-layer insulating layer 43 is connected to the conductive area 42A. Afterwards, a first diffusion barrier layer 47 for preventing mutual diffusions between the tungsten plug 46 and a bottom electrode 49 is formed on top of the tungsten plug 46 and the inter-layer insulating layer 43. Subsequently, a second diffusion barrier layer 48 for preventing a constitutional material of the first diffusion barrier layer 47 from diffusing into the bottom electrode 49 is formed on the first diffusion barrier layer 47, and the bottom electrode 49, a dielectric layer 50 and a top electrode 51 are stacked on the second diffusion barrier layer 48. Also, a Ti/TiN diffusion barrier layer 44 for preventing a constitutional material of the tungsten plug 46 from diffusing into the conductive area 42A is formed on between the tungsten plug 46 and the conductive area 42A. Meanwhile, a titanium silicide 45, which is an ohmic contact, is formed on between the Ti/TiN diffusion barrier layer 44 and the conductive area 42A.

Referring to FIG. 5, in accordance with the third preferred embodiment, the tungsten plug 46 is a connecting element connecting the conductive area 42a like a source/drain of a transistor to the bottom electrode 49 of a capacitor. The first diffusion barrier layer 47 formed between the tungsten plug 46 and the bottom electrode 49 has an exposed barrier structure wherein the first diffusion barrier layer 47 is not buried within the contact hole 43A. The second diffusion barrier layer 48 also has an exposed structure.

Figure 6:
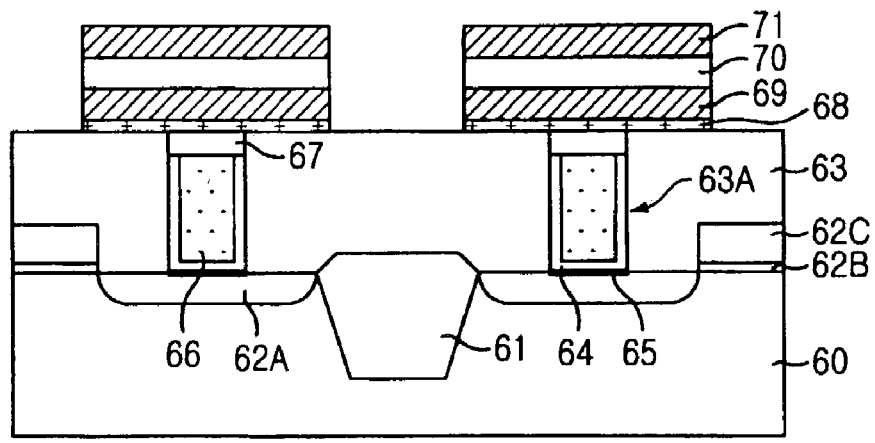
FIG. 6 is a cross-sectional view of a semiconductor device in accordance with a forth preferred embodiment of the present invention.

FIG. 6 is a cross-sectional view of a semiconductor device in accordance with a forth preferred embodiment of the present invention.

With reference to FIG. 6, a field oxide layer 61, which is a device isolation layer, and a conductive area 62A such like a source/drain of a transistor are formed. An interlayer insulating layer 63 is formed on top of a substrate 60 on which a gate oxide layer 62B and a gate electrode 62C are formed and surfaces of the field oxide layer 61 and the conductive area 62A. A tungsten plug 66 partially buried into a contact hole 63A that passes through the inter-layer insulating layer 63 is connected to the conductive area 62A. Afterwards, a first diffusion barrier layer 67 for preventing mutual diffusions between the tungsten plug 66 and a bottom electrode 69 is formed on top of the tungsten plug 66 so as to completely fill the contact hole 63A. Subsequently, a second diffusion barrier layer 68 for preventing a constitutional material of the first diffusion barrier layer 67 from diffusing into the bottom electrode 69 is formed on the first diffusion barrier layer 67, and the bottom electrode 69, a dielectric layer 70 and a top electrode 71 are stacked on the second diffusion barrier layer 68. Also, a Ti/TiN diffusion barrier layer 64 for preventing a constitutional material of the tungsten plug 66 from diffusing into the conductive area 62A is formed on between the tungsten plug 66 and the conductive area 62A. Meanwhile, a titanium silicide 65, which is an ohmic contact, is formed on between the Ti/TiN diffusion barrier layer 64 and the conductive area 62A.

Referring to FIG. 6, in accordance with the forth preferred embodiment, the tungsten plug 66 is a connecting element connecting the conductive area 62A such like a source/drain of a transistor to the bottom electrode 69 of a capacitor. The first diffusion barrier layer 67 formed on between the tungsten plug 66 and the bottom electrode 69 has a buried barrier structure wherein the first diffusion barrier layer 67 is buried within the contact hole 63A. On the other hand, the second diffusion barrier layer 68 has an exposed barrier structure wherein the second diffusion barrier layer 68 is not buried within the contact hole 63A.

The above-mentioned buried barrier structure in accordance with the forth preferred embodiment prevents lateral sides of the first diffusion barrier layer 67 from being exposed during a subsequent thermal process compared to the exposed barrier structure described in FIG. 5. Since the first diffusion barrier layer 67 formation is omitted when patterning the capacitor, it is an ease of a patterning process applied to the capacitor.

In the mean time, in FIGS. 5 and 6, the first diffusion barrier layers 47 and 67 are nitride-based thin films containing Cr, while the second diffusion barrier layers 48 and 68 are conductive oxides such like a metal oxide layer.

For example, the first diffusion barrier layer 47 and 67 are thin films of $Cr_xMe_{1-x}N$ containing metal mixed of Cr, N and Me, and selected among $Cr_xTi_{1-x}N$, $Cr_xTa_{1-x}N$ and $Cr_xAl_{1-x}N$. Herein, X ranges from about 0.2 mol to about 0.8 mol. The second diffusion barrier layers 48 and 68 are selected among $IrO_2$, $RuO_2$ and $SrRuO_3$.

Also, the bottom electrodes 49 and 69 and the top electrodes 51 and 71 are selected from a group consisting of Pt, Ir, $IrO_2$, Ru, $RuO_2$, Re, Rh and a mixture of the above listed materials. The dielectric layers 50 and 80 are selected from a high dielectric material such as $(Ba,Sr)TiO_3$ (BST) and $SrTiO_3$ (ST) or a ferroelectric material such as $Pb(Zr,Ti)O_3$ (PZT), $SrBi_2Ta_2O_9$ (SBT) and $(Bi,La)_4Ti_3O_{12}$ (BLT).

In addition, the inter-layer insulating layers 43 and 63 are selected from an oxide, a nitride or a mixture of these two. For instance, the inter-layer insulating layers 43 and 63 are selected from a group consisting of silicon oxide-based oxides such as tetra ethyl ortho silicate (TEOS), PSG and BPSG, silicon nitride-based nitrides such as SiON and $Si_3N_4$ and a mixture of the above two.

In accordance with the third and the forth preferred embodiments of the present invention, the tungsten plugs 46 and 66 are connecting elements connecting the conductive areas 42A and 62A such as a source/drain of a transistor to the bottom electrodes 49 and 69 of the capacitor, respectively. The first diffusion layers 47 and 67 containing Cr are allocated on between the tungsten plug 46 and 66 and the bottom electrodes 49 and 69, respectively. Also, the second diffusion barrier layers 48 and 68 made of conductive oxides are disposed between the first diffusion barrier layer 47 and 67 and the bottom electrodes 49 and 69, respectively.

Eventually, use of the first diffusion barrier layers 47 and 67 containing Cr and the tungsten plugs 46 and 66, which do not react with Cr prevent mutual diffusions of the Cr and the tungsten (W), each being a constitutional material of the first diffusion barrier layers 47 and 67 and the tungsten plugs 46 and 66, respectively. Also, it is possible to prevent the Cr from diffusing into the bottom electrodes 49 and 69 by disposing the second diffusion layers 48 and 68 between the first diffusion barrier layer 47 and 67 and the bottom electrodes 49 and 69, respectively.

Accordingly, the semiconductor device in accordance with the third and the forth preferred embodiments adopting the tungsten plugs 46 and 66 is improved on contact resistance of the contact plug compared to the semiconductor device in accordance with the first and the second preferred embodiments adopting the polysilicon plugs. As a reference, in case of the polysilicon plug, there occur mutual diffusions between Cr provided from the $Cr_xMe_{1-x}N$ thin film, where X=about 0.2 mol ~0.8 mol, and the silicon. The mutual diffusions between the Cr and silicon increase the contact resistance.

Figure 7A:
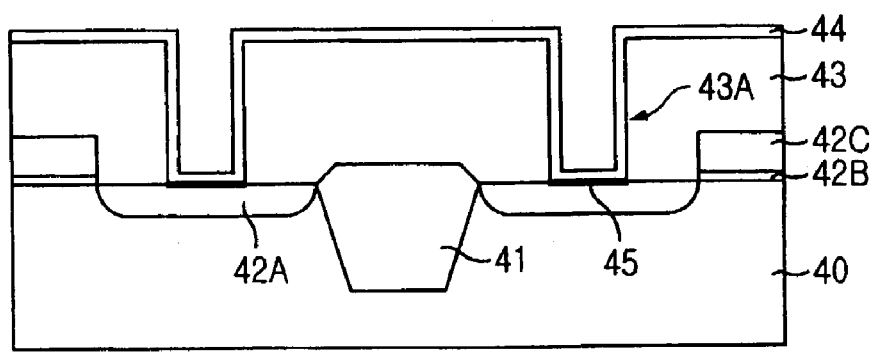
FIGS. 7A to 7C are cross-sectional views illustrating a method for fabricating the semiconductor device of FIG. 5.
Figure 7B:
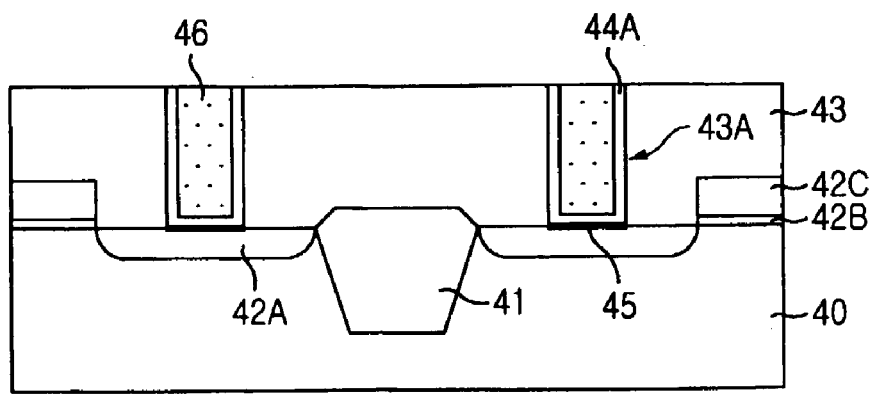
Figure 7C:
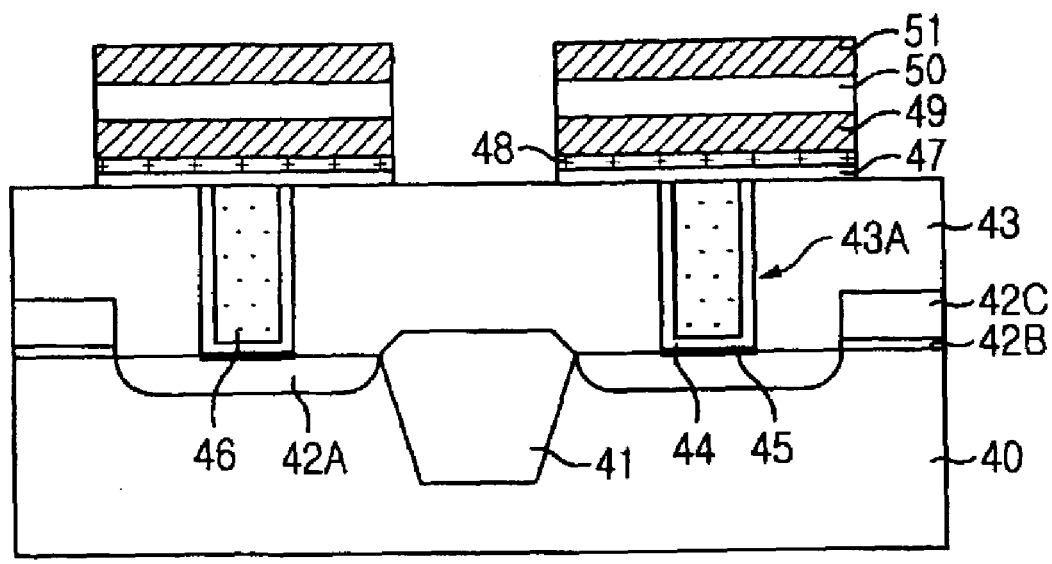

FIGS. 7A to 7C are cross-sectional views illustrating a method for fabricating the semiconductor device as shown in FIG. 5.

Referring to FIG. 7A, a field oxide layer 41, which is a device isolation layer is formed on a substrate 40, and a gate oxide layer 42B and a gate electrode 42C are formed on the substrate 40. Then, the substrate 40 is doped with impurities to form a conductive area 42A, and an inter-layer insulating layer 43 is deposited and planarized on the substrate 40. Afterwards, a contact mask (not shown) defining a SNC is formed on the inter-layer insulating layer 43. The interlayer insulating layer 43 is then etched by using the contact mask as an etch mask so to form a contact hole 43A exposing the conductive area 42A.

Next, a Ti layer and a TiN layer are sequentially deposited on the inter-layer insulating layer 43 including the contact hole 43A. In particular, the Ti layer is deposited to a thickness ranging from about 50 Å to about 200 Å, while the TiN layer is deposited to a thickness ranging from about 100 Å to about 500 Å. Herein, a stacked layer of the Ti/TiN is a barrier layer for preventing impurities from diffusing into the conductive area 42A when depositing a subsequent tungsten layer. Hereinafter, the stacked layer of Ti/TiN is abbreviated as a Ti/TiN diffusion barrier layer 44.

Subsequently, a rapid thermal process (RTP) for a silicidation reaction is performed at a temperature ranging from about 700° C. to about 900° C. so that a titanium silicide layer 45 is formed through a reaction between a silicon atom of the conductive area 42A and a titanium (Ti) atom provided from a bottom layer, i.e., the Ti layer of the Ti/TiN diffusion barrier layer 44. At this time, the titanium silicide layer 45 is solely formed on an interface between the conductive area 42A and the Ti layer. This titanium silicide layer 45 is an ohmic contact layer used for improving contact resistance between the conductive area 42A and a subsequent tungsten plug 46.

As described in the above, in case of forming the titanium silicide layer 45 through the thermal process, a top layer, i.e., the TiN layer of the Ti/TiN diffusion barrier layer 44 prevents the Ti layer from being exposed to air before performing the thermal process, thereby preventing a native oxide layer from being formed due to a prolonged exposure of the Ti layer to air and protecting the Ti layer from contaminants.

With reference to FIG. 7B, a tungsten layer is deposited on the Ti/TiN diffusion barrier layer 44 until completely filling the contact hole 43A through a chemical vapor deposition (CVD) technique providing excellent step coverage. Then, the tungsten layer is proceeded with an etch-back process until exposing a surface of the inter-layer insulating layer 43 so that the tungsten plug 46 is buried inside of a portion of the Ti/TiN diffusion barrier layer 44 in the contact hole 43A. At this time, the Ti/TiN diffusion barrier layer 44 formed on the inter-layer insulating layer 43 is simultaneously proceeded with the etch-back process so as to be remained as a Ti/TiN diffusion barrier layer 44A only within the contact hole 43A. Hereinafter, this Ti/TiN diffusion layer remaining only within the contact hole 43A is called remaining Ti/TiN diffusion barrier layer 44A.

Eventually, layers buried within the contact hole 43A are the titanium silicide layer 45, the remaining Ti/TiN layer 44A and the tungsten plug 46, and these are connection elements for electrically connecting a bottom electrode 49 of a capacitor to the conductive area 42A.

These connection elements, particularly, an upper surface of the tungsten plug 46 has a height identical to the surface of the inter-layer insulating layer 43, thereby providing a planarized structure after forming the tungsten plug 46 and prior to a subsequent process.

With reference to FIG. 7C, a first diffusion barrier layer 47, a second diffusion barrier layer 48, the bottom electrode 49, a dielectric layer 50 and a top electrode 51 are sequentially formed on the tungsten plug 46 and the interlayer insulating layer 43, and then, a stacked capacitor is formed through a capacitor patterning process.

Herein, the first diffusion barrier layer 47 is selected from $Cr_xTi_{1-x}N$, $Cr_xTa_{1-x}N$ or $Cr_xAl_{1-x}N$. Herein, X ranges from about 0.2 mol to about 0.8 mol. The second diffusion barrier layer 48 is selected from a group consisting of $IrO_2$, $RuO_2$ and $SrRuO_3$. Also, the bottom electrode 49 and the top electrodes 51 are selected from a group consisting of metal layers such as Pt, Ir, Ru, $RuO_2$, Re and Rh, conductive oxides such as $IrO_2$ and $RuO_2$ or a mixtures of the metal layer and the conductive oxides. The dielectric layer 50 is selected from a high dielectric material such as $(Ba,Sr)TiO_3$ (BST) and $SrTiO_3$ (ST) or a ferroelectric material such as $Pb(Zr,Ti)O_3$ (PZT), $SrBi_2Ta_2O_9$ (SBT) and $(Bi,La)_4Ti_3O_{12}$ (BLT).

In the meantime, in accordance with the third and the forth preferred embodiments, since the second diffusion layers 48 and 68 are conductive oxides, they can act as the bottom electrodes 49 and 69, respectively. Therefore, it is possible to form the bottom electrode having a stacked structure of which the most bottom layer is the conductive oxide after omitting the second diffusion barrier layers 48 and 68.

Figure 8A:
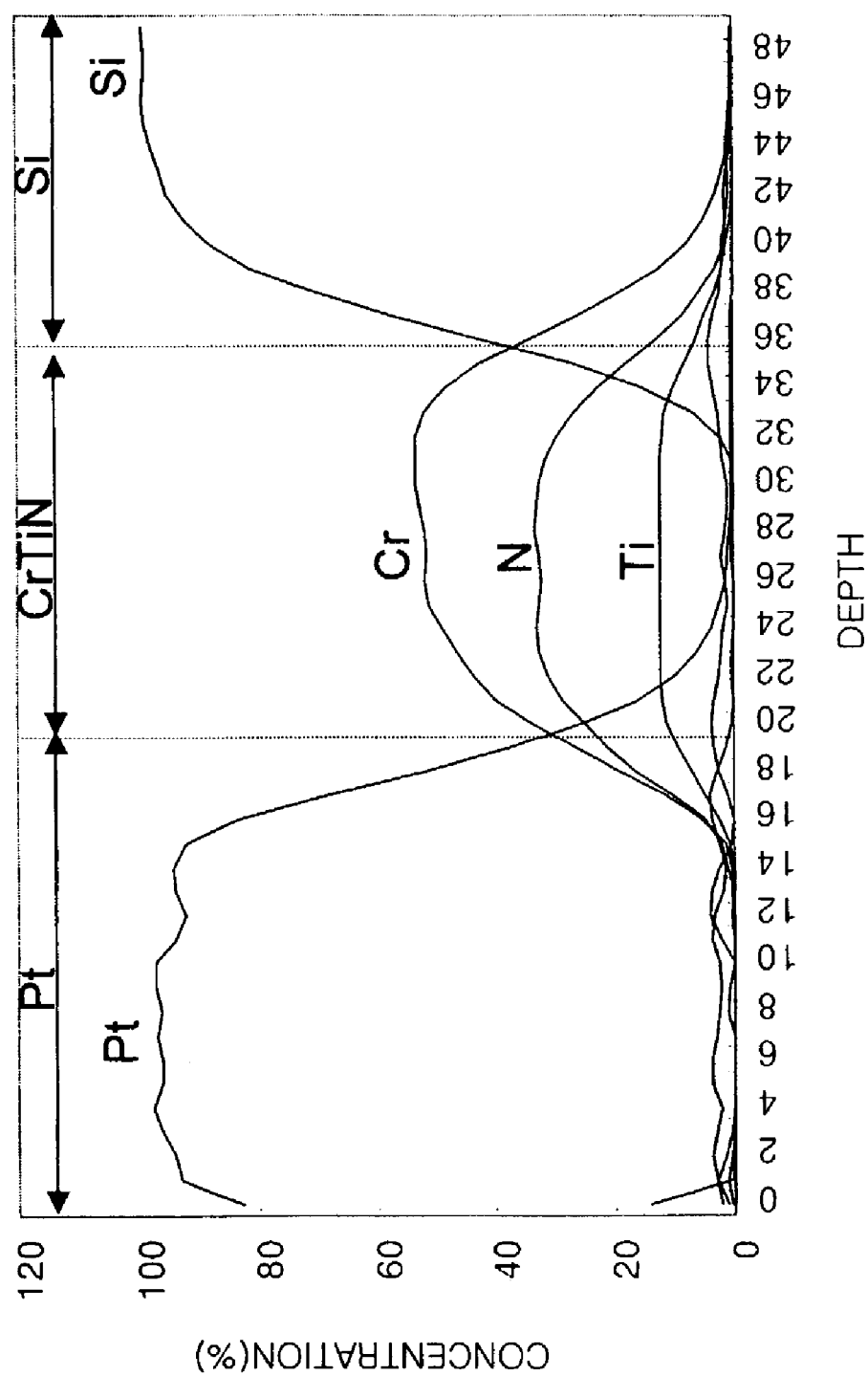

FIGS. 8A and 8B are graphs showing a result after analyzing a degree of mutual diffusions in a stacked structure of Pt/CrTiN/Si. Particularly, FIG. 8A shows a state of deposition before a thermal process, and FIG. 8B shows a result after performing the thermal process at a temperature of around 700° C. in an atmosphere of oxygen for about 1 hour. These results are analyses of constitutional elements in a direction of thickness by using an X-ray photoelectron spectroscopy (XPS).

Referring to FIGS. 8A and 8B, after performing the thermal process at a temperature of around 700° C. in an atmosphere of oxygen for about 1 hour, Si of a silicon layer passes through a CrTiN layer and is diffused into a surface of a Pt layer. On the other hand, Cr provided from the CrTiN layer is diffused only into the Pt layer, and Pt from the Pt layer is diffused into the Si layer.

Figure 9A:
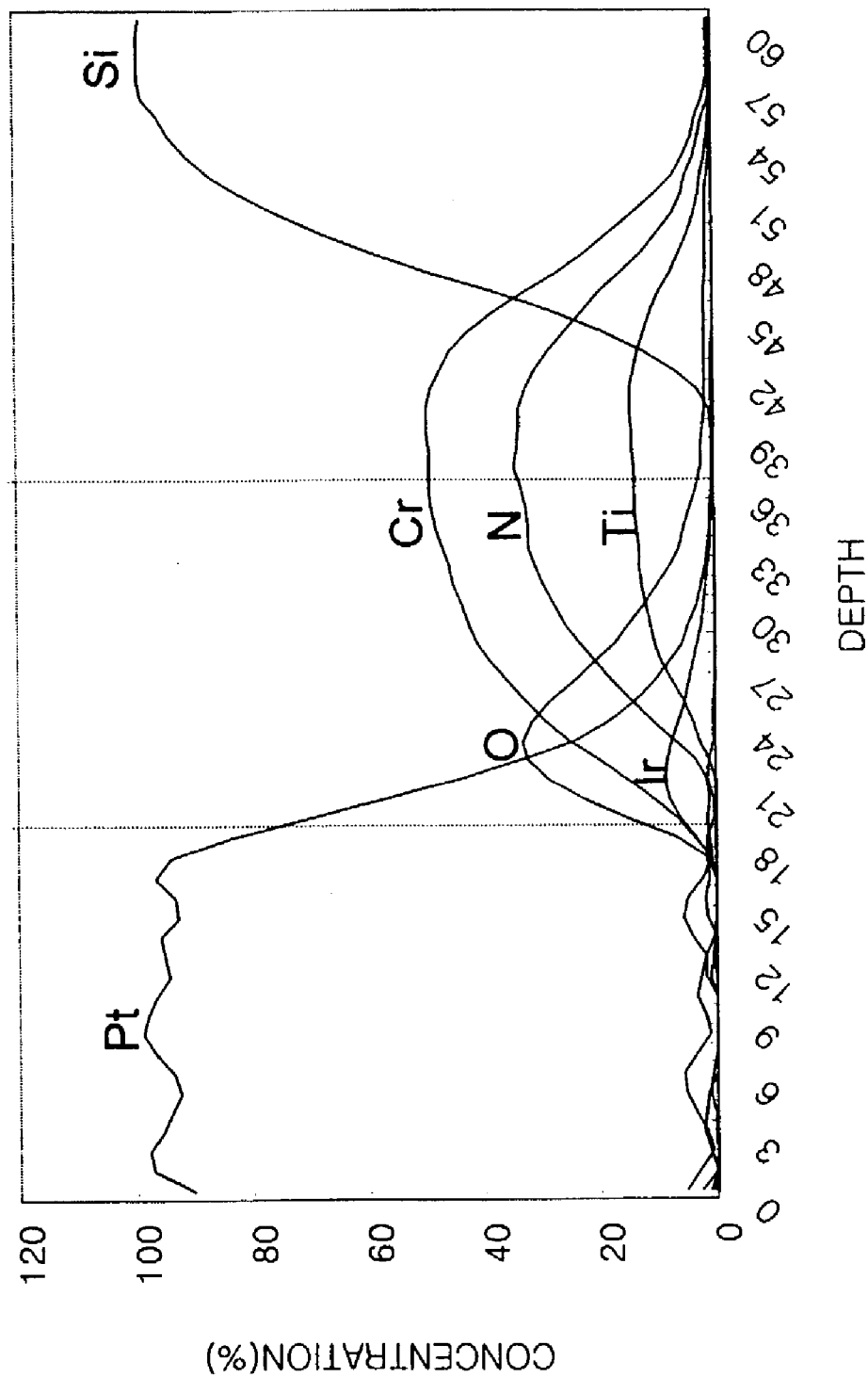
FIGS. 9A and 9B are graphs showing a result after analyzing a degree of mutual diffusions in a stacked layer of Pt/IrO$_2$/CrTiN/Si.
Figure 9B:
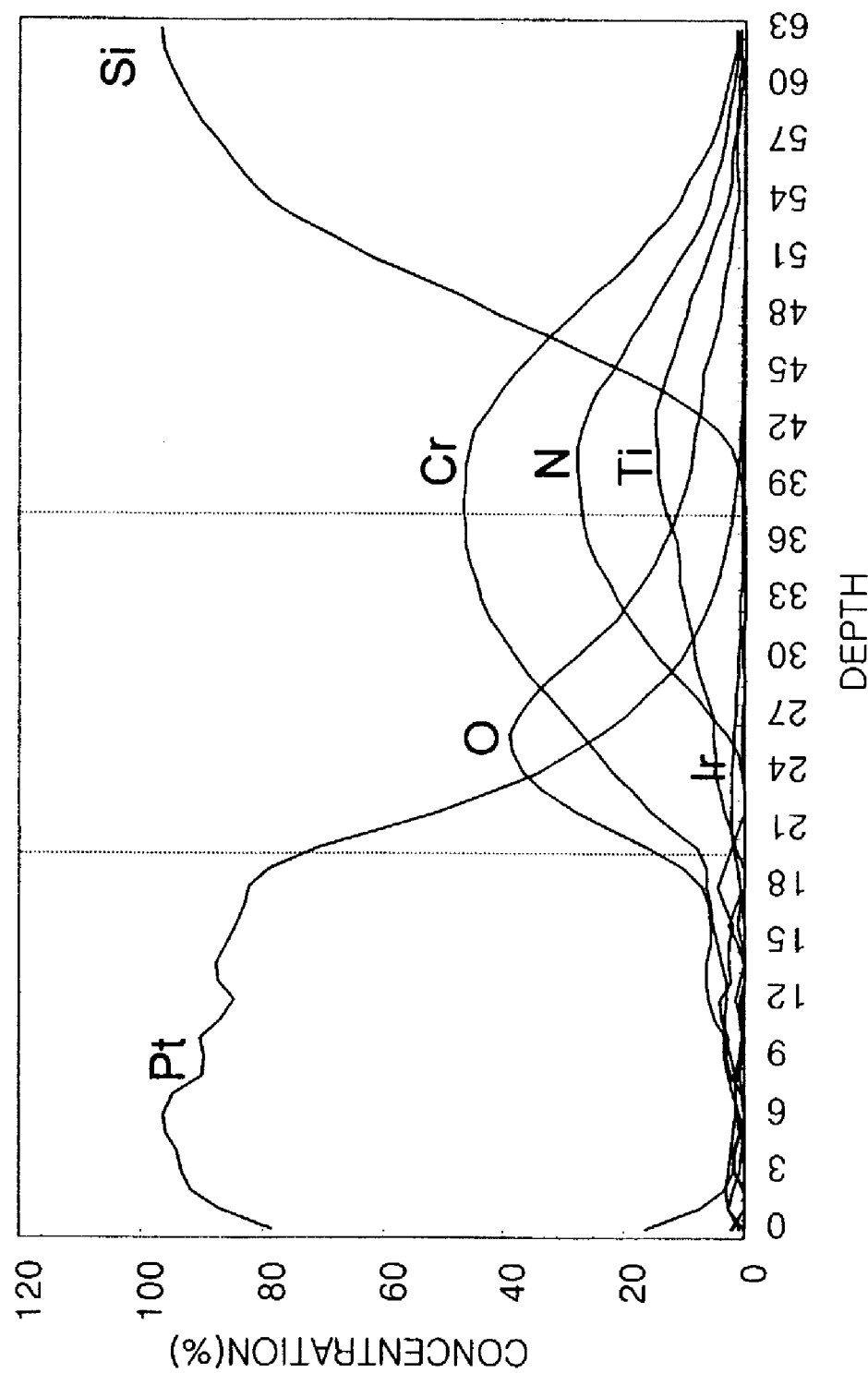

FIGS. 9A and 9B are graphs showing a result after analyzing a degree of mutual diffusions in a stacked layer of Pt/IrO$_2$/CrTiN/Si. In particular, FIG. 9A shows a state of deposition before a thermal process, and FIG. 9B shows a state after performing the thermal process at a temperature of around 700° C. in an atmosphere of oxygen for about 1 hour. These results are analyses of constitutional elements in a direction of thickness by using an XPS.

With reference to FIGS. 9A and 9B, there occurs nearly no mutual diffusion between each of the layers. Especially, contrary to the analysis result of the stacked layer including no IrO$_2$ layer as shown in FIG. 8, it is shown that Si in a Si layer is suppressed from being diffused into a CrTiN layer. The reason for this suppression of the Si diffusion is because of a CrO$_x$ layer formed at an interface between the CrTiN layer and the Si layer when depositing a conductive oxide layer.

In other words, the IrO$_2$ layer prevents the diffusions of the Cr provided from the CrTiN layer into a Pt layer and Pt from the Pt layer into the Si layer through the CrTiN layer.

Figure 10:
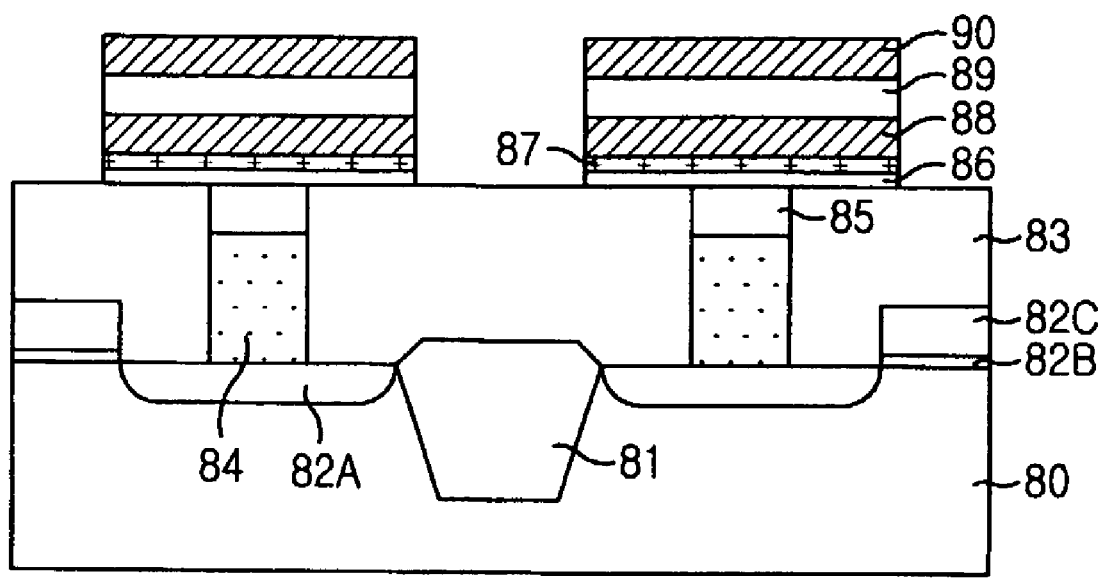
FIG. 10 is a cross-sectional view showing a semiconductor device in accordance with a fifth preferred embodiment of the present invention.

Meanwhile, even in case that a condition for suppressing the diffusion of the Si into the CrTiN layer is not satisfied (refer to FIG. 9B), the problem can be solved by placing the TiN diffusion barrier layer on between the polysilicon plug and the Cr$_x$Me$_{1-x}$N diffusion barrier layer (refer to FIG. 10).

FIG. 10 is a cross-sectional view showing a semiconductor device in accordance with a fifth preferred embodiment of the present invention.

Referring to FIG. 10, a field oxide layer 81, which is a device isolation layer, and a conductive area 82A such as a source/drain of a transistor are formed. Then, an inter-layer insulating layer 83 is formed on top of the field oxide layer 81 and the conductive area 82A and a substrate 80 on which a gate oxide layer 82B and a gate electrode 82C are formed. A polysilicon plug 84 buried partially within a contact hole passing through the inter-layer insulating layer 83 is connected to the conductive area 82A.

A diffusion barrier layer having a triple-layer structure for preventing mutual diffusions between the polysilicon plug 84 and a bottom electrode 88 is placed on between the polysilicon plug 84 and the bottom electrode 88, and the bottom electrode 88, a dielectric layer 89 and a top electrode 90 are sequentially deposited on the diffusion barrier layer so to form a stacked-type capacitor.

Although it is not shown in FIG. 10, a silicide layer can be disposed between the polysilicon plug 84 and the diffusion barrier layer. Herein, the silicide layer acts as an ohmic contact layer.

Specifically, the diffusion barrier layer having the triple layer structure includes a TiN diffusion barrier layer 85 being formed on the polysilicon plug 84 so to completely fill the contact hole, a Cr$_x$Me$_{1-x}$N diffusion barrier layer 86 being formed on the TiN diffusion barrier layer 85 by having a line width identical to the line width of the bottom electrode 88 and a conductive oxide diffusion barrier layer 87 being formed on the Cr$_x$Me$_{1-x}$N diffusion 86. Herein, X ranges from about 0.2 mol to about 0.8 mol, and M can be Ti, Ta or Al.

Herein, the TiN diffusion barrier layer 85 is a diffusion barrier layer for preventing Si provided from the polysilicon plug 84 from diffusing into the bottom electrode 88. Particularly, the TiN diffusion barrier layer 85 prevents mutual diffusions of Cr provided from the Cr$_x$Me$_{1-x}$N and Si from the polysilicon plug 84. Also, the Cr$_x$Me$_{1-x}$N diffusion barrier layer 86 is a diffusion barrier layer against oxygen and has excellent oxide resisting characteristic compared to the TiN diffusion barrier layer 85. The conductive oxide diffusion barrier layer 87 is a diffusion barrier layer for preventing diffusions of Cr provided from the Cr$_x$Me$_{1-x}$N diffusion barrier layer 86 into the bottom electrode 88.

As illustrated in FIG. 10, the TiN diffusion barrier layer 85 is placed on between the polysilicon plug 84 and the Cr$_x$Me$_{1-x}$N diffusion barrier layer 86 so as to prevent mutual diffusions of the Si and Cr, and the conductive oxide diffusion barrier layer 87 is placed between the Cr$_x$Me$_{1-x}$N diffusion barrier layer 86 and the bottom electrode 88 so as to prevent mutual diffusions of the Cr and constitutional material of the bottom electrode 88.

Herein, in addition to the TiN for the diffusion barrier layer 85 being placed between the polysilicon plug 84 and the Cr$_x$Me$_{1-x}$N diffusion barrier layer 86, such materials as Ti/TiN, TaN, TiAlN and TiSiN can be also used.

In the first to the fifth preferred embodiments, the Cr$_x$Me$_{1-x}$N layer, where X=about 0.2 mol ~0.8 mol and M=Ti, Ta and Al, and the conductive oxide layer can be deposited through a typical process for fabricating a semiconductor device, e.g., a reactive sputtering technique, a CVD technique or an atomic layer deposition (ALD) technique. Also, the deposition processes for depositing the Cr$_x$Me$_{1-x}$N layer and the conductive oxide layer are carried out at a temperature ranging from a room temperature to about 100° C. and a temperature ranging from about 200° C. to about 300° C., respectively.

For instance, in case of employing the reactive sputtering technique applied to the above Cr$_x$Me$_{1-x}$N layer, a Cr target and a metal (Me) target are used, a compositional ratio (X) of Cr contained within the Cr$_x$Me$_{1-x}$N layer can be easily changed by controlling a mixing ratio of Ar and N$_2$ gas used as a sputtering gas, a voltage supplied to the Cr target and the Me target, a distance between the substrate and the target and a temperature of the substrate.

The compositional ratio (X) of Cr as the above is an important variable that determines the oxide resisting characteristic of the Cr$_x$Me$_{1-x}$N layer. As the compositional ratio (X) of Cr increases from about 0.2 mol to about 0.8 mol, a speed of oxidation of the Cr$_x$Me$_{1-x}$N layer conversely decreases.

Accordingly, in case that the compositional ratio (X) of Cr ranges from about 0.2 mol to about 0.8 mol, it is observed of a good oxide resisting characteristic. In case of the compositional ratio (X) of Cr is smaller than about 0.2 mol, there is a problem that the Cr$_x$Me$_{1-x}$N layer has a similar characteristic to the TiN layer due to a small quantity of the Cr contained within the Cr$_x$Me$_{1-x}$N layer. Also, in case that the compositional ratio (X) of Cr is greater than about 0.8 mol, the Cr$_x$Me$_{1-x}$N layer has a similar characteristic to a CrN layer which is a secondary Cr layer, and thus, the speed of oxidation increases. This fact further results in degradations of the oxide resisting characteristics. Eventually, if the compositional ratio (X) of Cr is in a range between about 0.2 mol and about 0.8 mol, the Cr$_x$Me$_{1-x}$N layer, which is a tertiary Cr layer, has a better oxide resisting characteristic than such diffusion barrier layers as TiN, TaN, TiAlN and TiSiN and the secondary CrN layer.

It is preferable that each thickness of the $Cr_xMe_{1-x}N$ layer, where X=about 0.2~0.8 mol and M=Ti, Ta and Al, and the conductive oxide layer is a thickness providing characteristics of the diffusion barrier layer. Especially, it is not necessary to be thicker than the above acceptable thickness with a consideration of high integration. Therefore, each acceptable thickness for providing the characteristics of the integration and the diffusion barrier layer ranges from about 40 nm to about 100 nm and from about 10 nm to about 50 nm, respectively.

The present invention provides an advantage of preventing a sudden increase of contact resistance by preventing the oxidation of the storage node contact plug through the use of the diffusion barrier layer having excellent oxide resisting characteristic.

Also, the present invention provides another effect of improving electric characteristics of a highly integrated memory device by preventing mutual diffusions between the diffusion barrier layer and the bottom electrode and between the storage node contact plug and the diffusion barrier layer.

While the present invention has been described with respect to certain preferred embodiments, it will be apparent to those skilled in the art that various changes and modifications may be made without departing from the scope of the invention as defined in the following claims.

What is claimed is:

1. A semiconductor device which consists essentially of:
   a bottom electrode of a capacitor connecting to a substrate through a tungsten contact plug;
   a contact plug;
   a first diffusion barrier layer formed as a single layer connected to the contact plug, comprising CrXMe1-XN containing Cr, a metal (Me) and N, wherein the metal (Me) is at least one member selected from Ti and Ta, and, wherein the first diffusion barrier layer prevents mutual diffusion between the first diffusion barrier layer and the tungsten contact plug;
   a second diffusion barrier layer formed as a single layer connected to the first diffusion barrier layer, comprising a material selected from the group consisting of $IrO_2$, $RuO_2$ and $SrRuO_3$ disposed on the first diffusion barrier layer for preventing the Cr in the first diffusion barrier layer from diffusing into the bottom electrode, wherein the second diffusion barrier layer also prevents a constitutional material of the first diffusion barrier layer from diffusing into the bottom electrode;
   a bottom electrode formed on the second diffusion barrier layer;
   a dielectric layer disposed on the bottom electrode; and
   a top electrode disposed on the dielectric layer.

2. The semiconductor device as recited in claim 1, wherein a compositional ratio (X) of Cr contained in the CrXMe1-XN ranges from about 0.2 mol to about 0.8 mol.

3. The semiconductor device as recited in claim 1 further comprising:
   an ohmic contact layer formed between the substrate and the contact plug; and
   a third diffusion barrier layer for preventing a material in the contact plug from diffusing into a space between the ohmic contact layer and the contact plug.

4. The semiconductor device as recited in claim 3, wherein the third diffusion barrier layer is any one material selected from a group consisting of Ti/TiN, TiN, TaN, TiAlN and TiSiN.

* * * * *